United States Patent
Yoshida

(10) Patent No.: US 7,216,315 B2
(45) Date of Patent: May 8, 2007

(54) ERROR PORTION DETECTING METHOD AND LAYOUT METHOD FOR SEMICONDUCTOR INTEGRATED CIRCUIT

(75) Inventor: Takaki Yoshida, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 539 days.

(21) Appl. No.: 10/751,523

(22) Filed: Jan. 6, 2004

(65) Prior Publication Data

US 2004/0163018 A1    Aug. 19, 2004

(30) Foreign Application Priority Data

Feb. 13, 2003    (JP)    ............... 2003-034859

(51) Int. Cl.
| G06F 17/50 | (2006.01) |
| G06F 19/00 | (2006.01) |
| G01R 29/26 | (2006.01) |
| G01R 29/02 | (2006.01) |
| G01R 31/02 | (2006.01) |

(52) U.S. Cl. .............. 716/6; 716/10; 716/13; 716/14; 702/69; 702/79; 702/65; 703/16; 703/19; 324/523; 324/532; 324/537

(58) Field of Classification Search .......... 716/6, 716/10, 13, 14; 702/69, 79, 65; 703/16, 703/19; 324/523, 532, 537
See application file for complete search history.

(56) References Cited

U.S. PATENT DOCUMENTS

| 5,047,967 | A | * | 9/1991 | Sander et al. ............... 702/79 |
| 5,903,476 | A | * | 5/1999 | Mauskar et al. ............ 716/1 |
| 6,311,147 | B1 |  | 10/2001 | Tuan et al. |
| 6,345,379 | B1 | * | 2/2002 | Khouja et al. ............... 716/4 |
| 6,370,674 | B1 | * | 4/2002 | Thill ............................ 716/4 |
| 6,453,443 | B1 |  | 9/2002 | Chen et al. |
| 6,480,815 | B1 | * | 11/2002 | Olson et al. ................. 703/14 |
| 6,615,395 | B1 | * | 9/2003 | Hathaway et al. .......... 716/6 |
| 2003/0212538 | A1 | * | 11/2003 | Lin et al. ..................... 703/14 |
| 2003/0226122 | A1 | * | 12/2003 | Hathaway et al. .......... 716/2 |
| 2006/0095872 | A1 | * | 5/2006 | McElvain et al. ........... 716/1 |

FOREIGN PATENT DOCUMENTS

JP    7-239865    9/1995

OTHER PUBLICATIONS

Bobba et al., "Simultaneous Switching Noise in CMOS VLSI Circuits", 1999 Southwest Symposium on Mixed-Signal Design, Apr. 11, 1999, pp. 15-20.*
Takaki Yoshida et al., "A New Approach for Low Power Scan Testing", ITC International Test Conference, 2003, IEEE, pp. 480-487.

* cited by examiner

Primary Examiner—Phallaka Kik
(74) Attorney, Agent, or Firm—McDermott Will & Emery LLP

(57) ABSTRACT

For the purpose of readily specifying a portion of the circuit which has a high possibility of error occurring due to a variation in the supply voltage so that the specified vulnerable portion is countermeasured in a mask layout process, a simulation section simulates the operation of a semiconductor integrated circuit to obtain a transition timing of an input signal that is input to each circuit element. A simultaneous-operation circuit element number detecting section detects, based on a result of the simulation, the number of circuit elements which are supplied with the supply voltage through a common power supply line and in which transition timings of input signals occur within a predetermined time interval (e.g., 0.3 ns or shorter). A supply voltage variation level estimating section estimates the variation level of the supply voltage according to the number of circuit elements which is detected by the simultaneous-operation circuit element number detecting section.

11 Claims, 12 Drawing Sheets

ERROR PORTION DETECTING METHOD AND LAYOUT METHOD FOR SEMICONDUCTOR INTEGRATED CIRCUIT

BACKGROUND OF THE INVENTION

The present invention relates to an error portion detecting method and layout method for a semiconductor integrated circuit, wherein a portion of the semiconductor integrated circuit which has a high possibility of error occurring due to a variation in the supply voltage during the operation carried out based on a clock signal, for example, is specified, whereby the specified vulnerable portion is countermeasured in a mask layout process.

In recent years, an effect of a voltage drop which may occur due to a power supply line has been increasing along with the increase in scale and the progress of miniaturization of semiconductor integrated circuits. That is, when the supply voltage is varied due to a voltage drop, the delay time or the signal level is also varied, and the possibility of a malfunction of a circuit increases.

Conventionally, for the purpose of preventing the above errors and malfunction, all of the design margins, such as a delay margin, and the like, have been increased, or the wire width for the power supply has been increased. However, such countermeasures make a design complicated or increase the number of gates and the chip area and accordingly increase the production cost.

In view of the above, there is a method which has been employed with more frequency wherein a variation in the supply voltage is calculated by simulating the operation of a circuit with consideration for the resistance and capacitance of wires, or the like, and the calculated voltage variation is fed back into the design and layout of a circuit. More specifically, in a known simulation technique, the voltage at a power supply terminal is calculated from, for example, the impedance value of the power supply line, the switching time information of a logic cell, and the current characteristics of the logic cell, and the delay time of the logic cell is calculated based on the calculated power supply terminal voltage to simulate the circuit operation (see, for example, Japanese Unexamined Patent Publication No. 7-239865).

However, in the case where the above simulation is carried out with high accuracy, a simulation apparatus requires abundant computer resources and an enormous length of time, and therefore, it is actually difficult to simulate the entire operation of a large-scale semiconductor integrated circuit with sufficient accuracy. Thus, it is difficult to build up a circuit design and layout design with quick and proper comprehension of the effect of a variation in the supply voltage.

SUMMARY OF THE INVENTION

An objective of the present invention that was conceived in view of the above is to readily specify a portion of a circuit which has a high possibility of error occurring due to a variation in the supply voltage so that countermeasures for the error are provided in a mask layout process.

The first method of the present invention that was conceived for the purpose of achieving the above objective is an error portion detecting method for a semiconductor integrated circuit, comprising: a transition timing detecting step of detecting a transition timing of an input signal input to, or a transition timing of an output signal output from, each of circuit elements which are supplied with a supply voltage through a common power supply line; a simultaneous-operation circuit element number detecting step of detecting the number of circuit elements in which the transition timing of the input signal or output signal occurs within a predetermined time interval; and a supply voltage variation level estimating step of estimating a supply voltage variation level based on the number of circuit elements which is detected at the simultaneous-operation circuit element number detecting step.

In the above structure, the transition timing of an input signal input to or an output signal output from each circuit element is detected at the transition timing detecting step. The number of circuit elements in which the transition timing occurs within a predetermined time interval is detected at the simultaneous-operation circuit element number detecting step. The supply voltage variation level is estimated based on the above detected number of circuit elements at the supply voltage variation level estimating step. Thus, a portion of the circuit which has a high possibility of error occurring due to a variation in the supply voltage is specified without a simulation that requires abundant computer resources and an enormous length of time, so that the specified vulnerable portion can be countermeasured in a mask layout process.

The second method of the present invention is based on the error portion detecting method of the first invention and characterized in that the supply voltage variation level estimating step includes the step of estimating the supply voltage variation level based on the variation of the transition timings detected at the transition timing detecting step.

With the above feature, the variation level of the supply voltage, which is determined by the accumulation of the effects of the variation in the supply voltage which is caused due to the operation of each circuit element, and which increases as the variation of the transition timings becomes smaller, is readily estimated with more accuracy.

The third method of the present invention is based on the error portion detecting method of the first method and characterized in that the circuit elements are transistors.

The fourth method of the present invention is based on the error portion detecting method of the first method and characterized in that the circuit elements are buffer circuits.

The fifth method of the present invention is based on the error portion detecting method of the first method and characterized in that: the circuit elements are scan flip-flops for testing the operation of the semiconductor integrated circuit; and the input signal is a clock signal which is input to the scan flip-flops.

With the above features, the variation level of the supply voltage which is caused by the circuit elements is accurately estimated.

The sixth method of the present invention is based on the error portion detecting method of the first method and characterized in that the transition timing detecting step includes the step of detecting the transition timing of the input signal or output signal by simulating the operation of the semiconductor integrated circuit.

The seventh method of the present invention is based on the error portion detecting method of the first method and characterized in that the transition timing detecting step includes the step of detecting the transition timing of the input signal or output signal based on a delay time caused by a circuit element and signal line for transmitting the input signal to each of the circuit elements.

With the above features, the transition timing is readily detected by a relatively small simulation, the four arithmetic operations, or the like. Thus, the variation level of the supply voltage is readily estimated.

The eighth method of the present invention is an error portion detecting method for a semiconductor integrated circuit, comprising: a circuit element number detecting step of detecting the number of circuit elements which are supplied with a supply voltage through a common power supply line and in which input signals are supposed to simultaneously transition when a delay caused by a signal line is neglected; and a supply voltage variation level estimating step of estimating a supply voltage variation level based on the number detected at the circuit element number detecting step.

According to the above invention, in the case where the variation of the transition timings of the input signals input to the respective circuit elements is relatively constant, the variation level of the supply voltage is estimated more readily by obtaining the number of circuit elements in which the input signals transition simultaneously with analysis at a logic design level where a delay is not considered.

A layout method for a semiconductor integrated circuit according to the present invention comprises: a transition timing detecting step of detecting a transition timing of an input signal input to, or a transition timing of an output signal output from, each of circuit elements which are supplied with a supply voltage through a common power supply line; a simultaneous-operation circuit element number detecting step of detecting the number of circuit elements in which the transition timing of the input signal or output signal occurs within a predetermined time interval; and a configuration determining step of determining the configuration of the circuit elements or the configuration of power supply lines based on the number of circuit elements which is detected at the simultaneous-operation circuit element number detecting step, such that any of the circuit elements is supplied with the supply voltage through a power supply line different from the common power supply line.

With the above feature, the configuration of circuit elements and power supply lines is determined based on the variation level of the supply voltage that is readily estimated as described above such that a malfunction which may be caused due to the variation in the supply voltage is suppressed.

An error portion detecting program for a semiconductor integrated circuit according to the present invention instructs a computer to execute the following steps: a transition timing detecting step of detecting a transition timing of an input signal input to, or a transition timing of an output signal output from, each of circuit elements which are supplied with a supply voltage through a common power supply line; a simultaneous-operation circuit element number detecting step of detecting the number of circuit elements in which the transition timing of the input signal or output signal occurs within a predetermined time interval; and a supply voltage variation level estimating step of estimating a supply voltage variation level based on the number of circuit elements which is detected at the simultaneous-operation circuit element number detecting step.

A layout program for a semiconductor integrated circuit according to the present invention instructs a computer to execute the following steps: a transition timing detecting step of detecting a transition timing of an input signal input to, or a transition timing of an output signal output from, each of circuit elements which are supplied with a supply voltage through a common power supply line; a simultaneous-operation circuit element number detecting step of detecting the number of circuit elements in which the transition timing of the input signal or output signal occurs within a predetermined time interval; and a configuration determining step of determining the configuration of the circuit elements or the configuration of power supply lines based on the number of circuit elements which is detected at the simultaneous-operation circuit element number detecting step, such that any of the circuit elements is supplied with the supply voltage through a power supply line different from the common power supply line.

With the above programs, a portion of the circuit which has a high possibility of error occurring due to a variation in the supply voltage is readily specified by the above-described mechanism, so that the specified vulnerable portion can be countermeasured in a mask layout process.

DESCRIPTION OF THE PREFERRED EMBODIMENTS

Hereinafter, embodiments of the present invention will be described with reference to the drawings.

(Embodiment 1)

Figure 1:
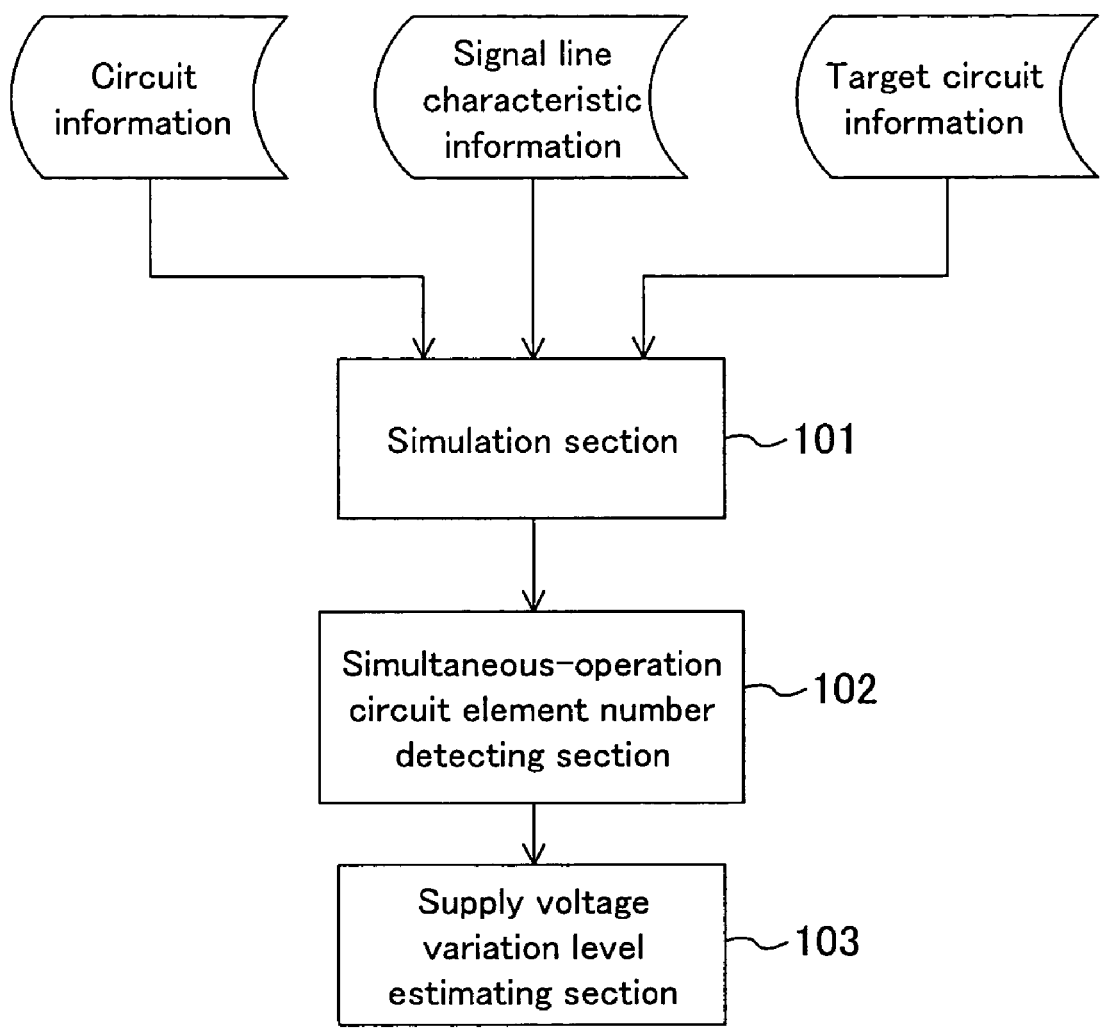
FIG. 1 is a block diagram showing a functional structure of an error portion detecting device of embodiment 1.

An error portion detecting device of embodiment 1 is realized by, for example, a computer and software installed thereon, but is functionally formed by a simulation section 101, a simultaneous-operation circuit element number detecting section 102 and a supply voltage variation level estimating section 103 as shown in FIG. 1.

The simulation section 101 simulates the operation of a semiconductor integrated circuit to calculate the transition timing of a signal input to each circuit element. More specifically, the operation of the circuit is simulated based on the circuit information which represents characteristics of each circuit element, including a delay characteristic, and the relationship between circuit elements, and the signal line characteristic information which represents the transfer characteristic of each signal line after a signal line layout process, in order to calculate the transition timing of a signal input to each circuit element. The simulation can be achieved by a simple simulation method wherein a delay caused by circuit elements and signal lines is considered, but a variation in the supply voltage is not considered (i.e., it is assumed that a constant supply voltage is supplied). This is because, in the device of the present invention, the effects of the variation in the supply voltage can be comprehended based on an estimation result of the supply voltage variation level estimating section 103, as described later, without calculating the absolute variation in the supply voltage by simulation. The above simulation is not necessarily performed on the entire operation of the semiconductor integrated circuit, but it is only necessary to perform the simulation on a group of circuit elements in which the number of circuit elements included is equal to or greater than a predetermined number, which are supplied with the supply voltage through a common power supply line, and which has a high possibility that signals input to these circuit elements simultaneously transition, and on circuit elements relevant to the operation of such circuit elements, based on target circuit information of these circuit elements. The group of circuit elements having a high possibility that their input signals simultaneously transition means a group of circuit elements to which the same signal is input or to which the same signal is input after passing through the same number of logic circuit stages. (Selection of such circuit elements is readily performed by analysis at a logic design level where a delay caused by signal lines is not considered.) The common power supply line may be any of the high voltage-side power supply line and low voltage-side power supply line.

The simultaneous-operation circuit element number detecting section 102 detects, based on a result of the above simulation, the number of circuit elements which are supplied with the supply voltage through a common power supply line and in which the transition timings of input signals occur within a predetermined time range (for example, within a time interval equal to or shorter than 0.3 ns).

The supply voltage variation level estimating section 103 estimates the variation level of the supply voltage according to the number of circuit elements which has been detected by the simultaneous-operation circuit element number detecting section 102.

Figure 2:
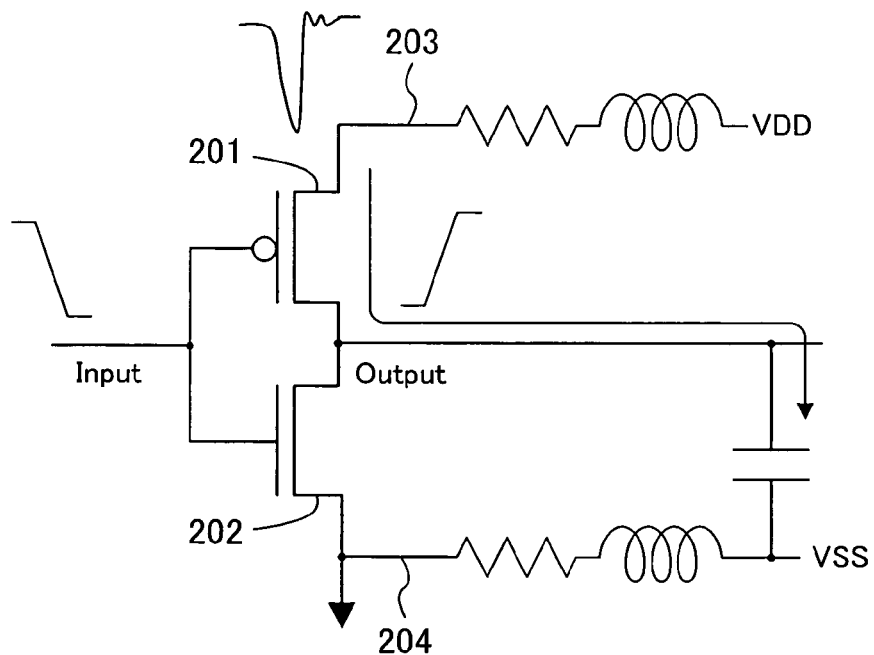
FIG. 2 illustrates an example of the variation in the supply voltage which may occur due to a transition of an input signal.

Herein, the supply voltage variation caused by the transition of an input signal is now briefly described. For example, in an inverter circuit including a P-channel transistor 201 and a N-channel transistor 202 shown in FIG. 2, when the input signal transitions from H (High) level to L (Low) level, the P-channel transistor 201 is turned ON whereas the N-channel transistor 202 is turned OFF, whereby a load capacitor is charged. At this point in time, the voltage of a power supply line 203 changes because the power supply line 203 has a resistance component and an inductance component. Specifically, the voltage of the power supply line 203 drops over a period of about 1.2 ns. If a different transistor which is supplied with the supply voltage through the common power supply line 203 is switched with a time difference of about 0.3 ns or smaller, the effects of the supply voltage variation accumulate to increase the variation level, and accordingly, the circuit is more likely to malfunction. It should be noted that a variation in the supply voltage may occur not only when the transistors are switched to charge a capacitor with a load capacitance but also when the capacitor is discharged and may occur not only in the high voltage-side power supply line 203 but also in a low voltage-side power supply line 204.

Hereinafter, the principle of specifying a portion of a circuit which has a high possibility that an error occurs due to a variation in the supply voltage is described with specific circuit examples.

Figure 3:
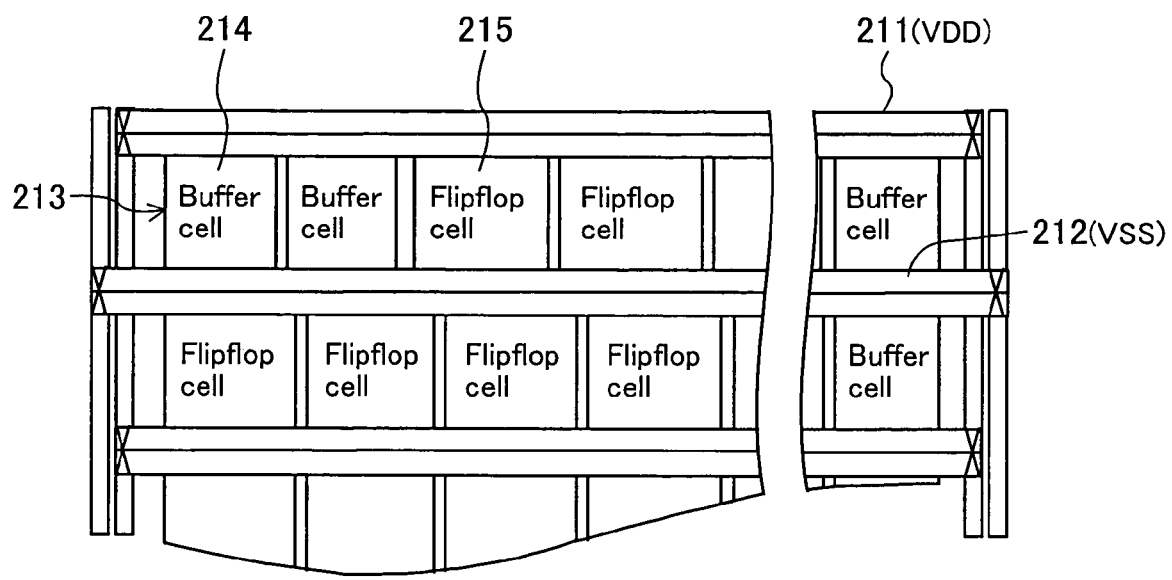
FIG. 3 shows an example of the configuration of circuit elements and power supply lines in a semiconductor integrated circuit.
Figure 4:
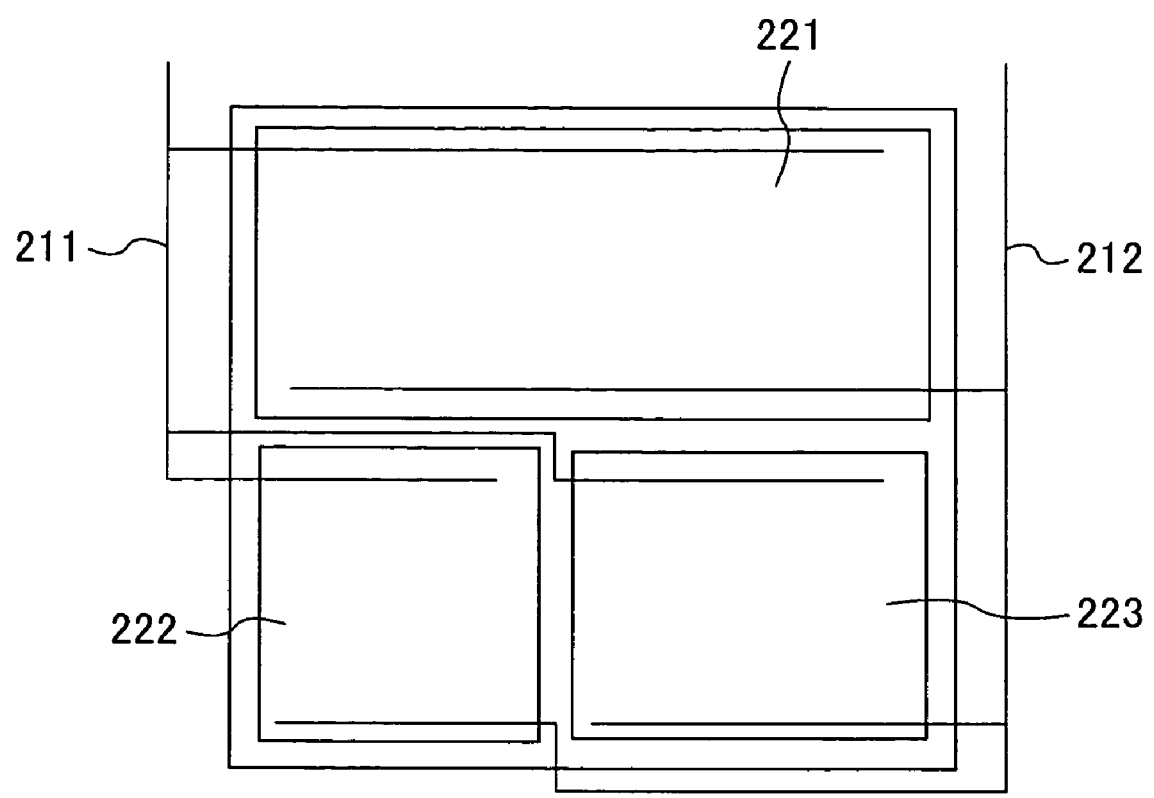
FIG. 4 shows another example of the configuration of circuit elements and power supply lines in a semiconductor integrated circuit.

For example, a semiconductor integrated circuit includes circuit elements, such as buffer cells 214, flip-flop cells 215, and the like, in lanes 213 between power supply lines (VDD) 211 and power supply lines (VSS) 212 as shown in FIG. 3. These circuit elements are commonly supplied with the supply voltage through the power supply lines 211 and 212. In another semiconductor integrated circuit arrangement shown in FIG. 4, for example, circuit elements are grouped into circuit blocks 221 to 223, and each circuit block is provided with a pair of power supply lines 211 and 212. Also in this case, the circuit elements included in each of the circuit blocks 221 to 223 are commonly supplied with the supply voltage through the corresponding power supply lines 211 and 212.

Figure 5:
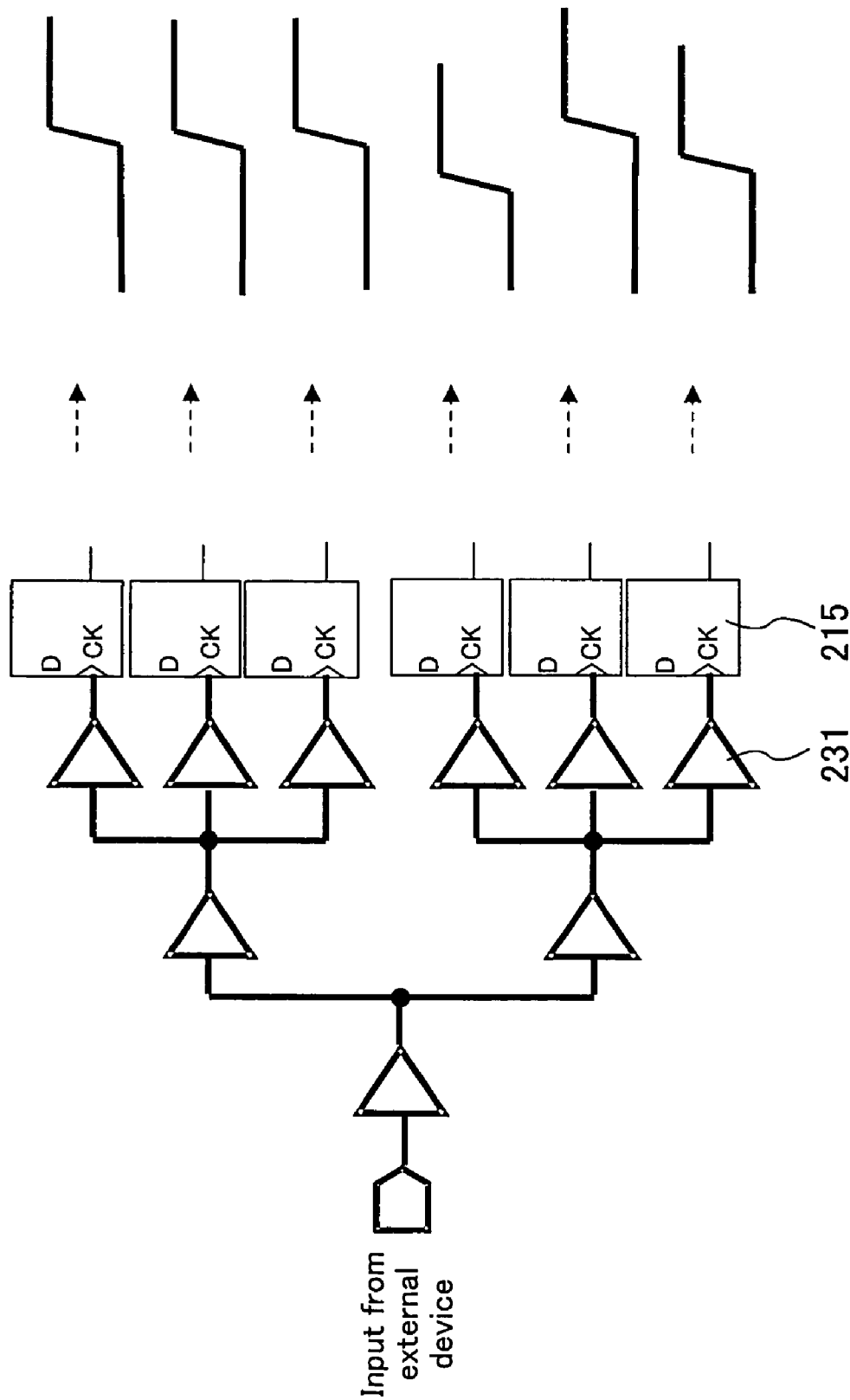
FIG. 5 shows a circuit diagram which illustrates a connection of a clock tree synthesis buffer and flip-flop cells and a timing chart which illustrates the transition timings of signals input to the flip-flop cells.
Figure 6:
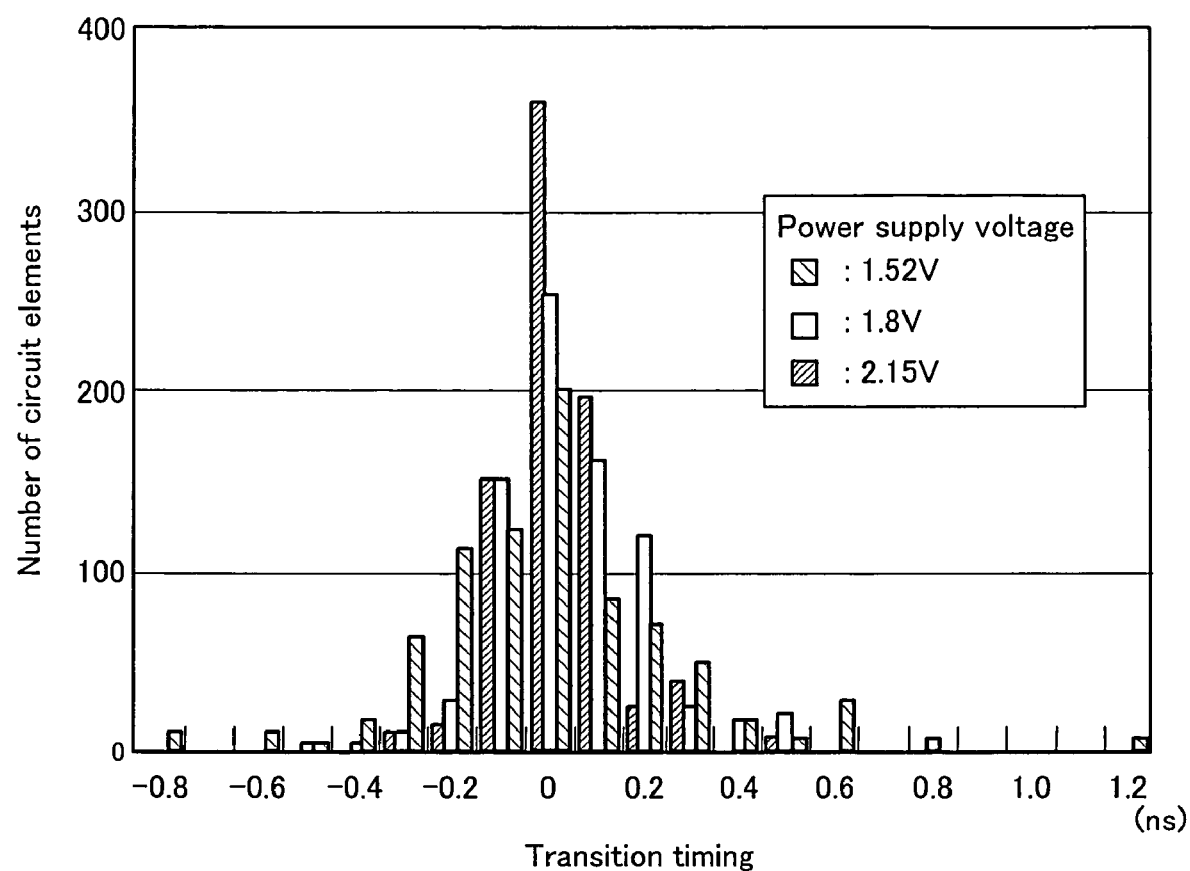
FIG. 6 is a graph illustrating a distribution of the transition timings of input signals.

In an alternative example where equivalent signals are respectively input to a plurality of circuit elements, for example, in an example shown in FIG. 5 where clock signals which have passed through the same number of stages of clock tree synthesis buffers 231 are input to the flip-flop cells 215, the transition timings of the clock signals input to the flip-flop cells 215 are the same at a logic design level where a delay caused by signal lines is not considered. However, a delay is actually caused due to the effects of capacitance components of signal lines, or the like. For example, the transition timings are not always strictly the same as shown in FIG. 6. In this case, if the transition timings occur within a time interval of, for example, about 0.3 ns or shorter, the effects of variations in the supply voltage accumulate, whereby the variation level of the supply voltage is increased, and the circuit is more likely to malfunction.

In view of the above, in the error portion detecting device of embodiment 1, the simulation section 101 specifies the transition timing of the clock signal input to each flip-flop cell 215, and the simultaneous-operation circuit element number detecting section 102 detects the number of flip-flop cells 215 that receive the clock signals which transition within a time interval of 0.3 ns (i.e., the number of flip-flop cells 215 that operate simultaneously), whereby an index that is determined according to the variation level of the voltage of the power supply lines 211 is obtained. That is, the supply voltage variation level estimating section 103 calculates the ratio of the number of flip-flop cells 215 that operate simultaneously between the lanes 213 or between the circuit blocks 221 to 223. Alternatively, the supply voltage variation level estimating section 103 determines whether or not the number of the flip-flop cells 215 that operate simultaneously is greater than a predetermined number. It should be noted that, alternatively, the supply voltage variation level estimating section 103 may output the number of flip-flop cells 215 that operate simultaneously, which has been received from the simultaneous-operation circuit element number detecting section 102. Now, consider a case where the number of flip-flop cells 215 that operate simultaneously in one of the lanes 213 is greater than in any of the other lanes 213. In this case, it is estimated that a variation in the supply voltage in the other lanes 213 is smaller than in this lane 213. Thus, if it is verified by a highly-accurate simulation that the circuit elements in this lane operate appropriately, it is estimated that the circuit elements in the other lanes also operate appropriately. Therefore, a test for the operation of many circuit elements can be omitted. Alternatively, when a highly-accurate simulation is performed only on circuit elements in one lane to confirm a certain relationship between the number of flip-flop cells 215 that operate simultaneously in this lane and the proper width of a corresponding power supply line, the width of the other power supply lines is readily determined based on the confirmed relationship and the number of flip-flop cells 215 that operate simultaneously in the other lanes such that the effect of a variation in the supply voltage is reduced. Alternatively, when the number of flip-flop cells 215 that operate simultaneously is greater than a predetermined value (i.e., a variation in the supply voltage is large), it is readily possible to change the configuration of circuit elements (as described later) or to locally strengthen the power supply line by changing the position or width of the power supply line. Furthermore, the delay time is adjusted by changing the positions (routes) of signal lines or by adding/deleting delay elements, such as buffers, inverters, or the like, such that the transition timings of the input signals differ by 0.3 ns or more, whereby the variation in the supply voltage can readily be reduced. Specifically, the clock tree synthesis buffer 231 is originally used for suppressing a shift in the transition timing of an input signal but may be used for intentionally increasing the shift in the transition timing of the input signal within a tolerance in order to reduce the variation in the supply voltage and suppress a malfunction.

(Embodiment 2)

An error portion detecting device for a semiconductor integrated circuit according to embodiment 2 is described. It should be noted that, in the following embodiments, like elements are denoted by like reference numerals used in embodiment 1, and descriptions thereof are omitted.

Figure 7:
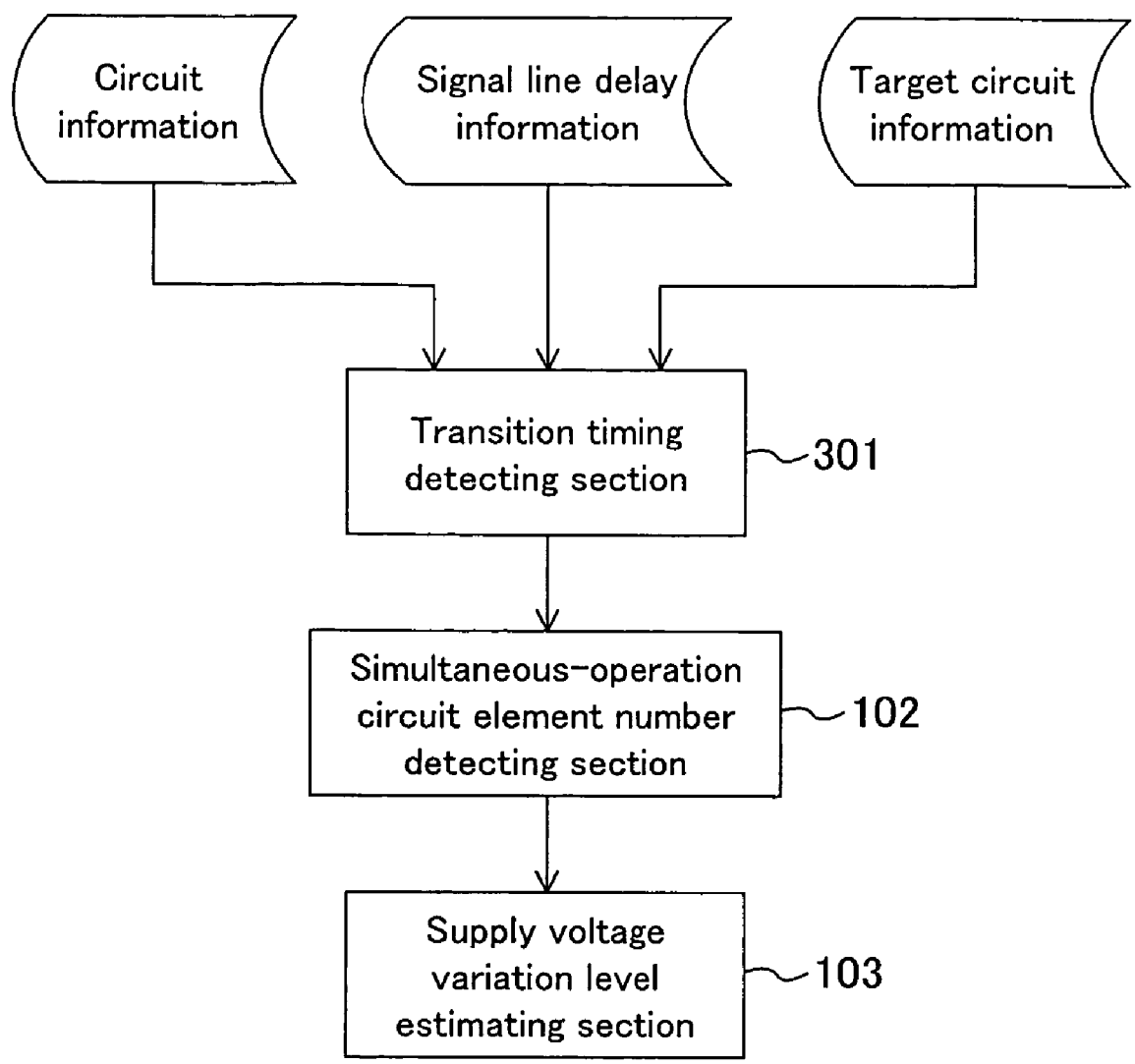
FIG. 7 is a block diagram showing a functional structure of an error portion detecting device of embodiment 2.
Figure 8:
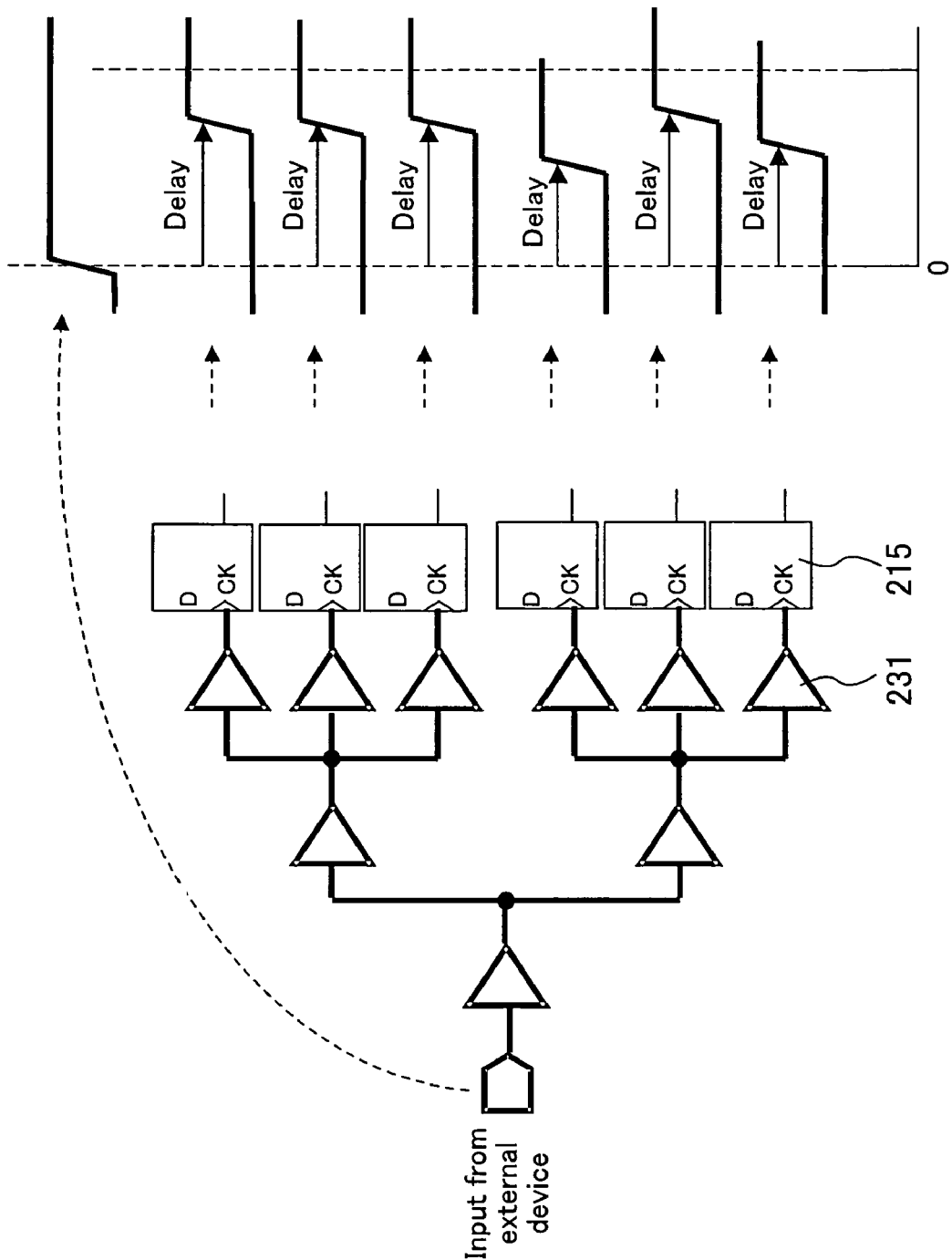
FIG. 8 shows a circuit diagram which illustrates a connection of a clock tree synthesis buffer and flip-flop cells and a timing chart which illustrates the transition timings of signals input to the flip-flop cells.

Referring to FIG. 7, the error portion detecting device of embodiment 2 includes a transition timing detecting section 301 in place of the simulation section 101 of embodiment 1. The transition timing detecting section 301 performs a so-called static timing analysis to determine a transition timing. More specifically, as shown in FIG. 8, the transition timing detecting section 301 calculates a delay time of an input signal (clock signal) input to each of circuit elements which are supplied with the supply voltage through a common power supply line based on circuit information that represents the characteristics of each circuit element, including the delay characteristic, and the connections among circuit elements, signal line delay information that represents the delay characteristic of a signal for each signal line after the signal line layout process, and target circuit element information, thereby determining the transition timing of the input signal.

In embodiment 2, detection of the number of circuit elements that operates simultaneously and estimation of the variation level of the supply voltage, which are performed based on the transition timings determined as described above, are the same as those described in embodiment 1.

Basically, calculation of the delay time as described above is achieved by simply summing the delay times of delay elements. Thus, the transition timing is determined more conveniently and more quickly to estimate the variation level of the supply voltage, and occurrence of malfunction is readily suppressed.

(Embodiment 3)

Figure 9:
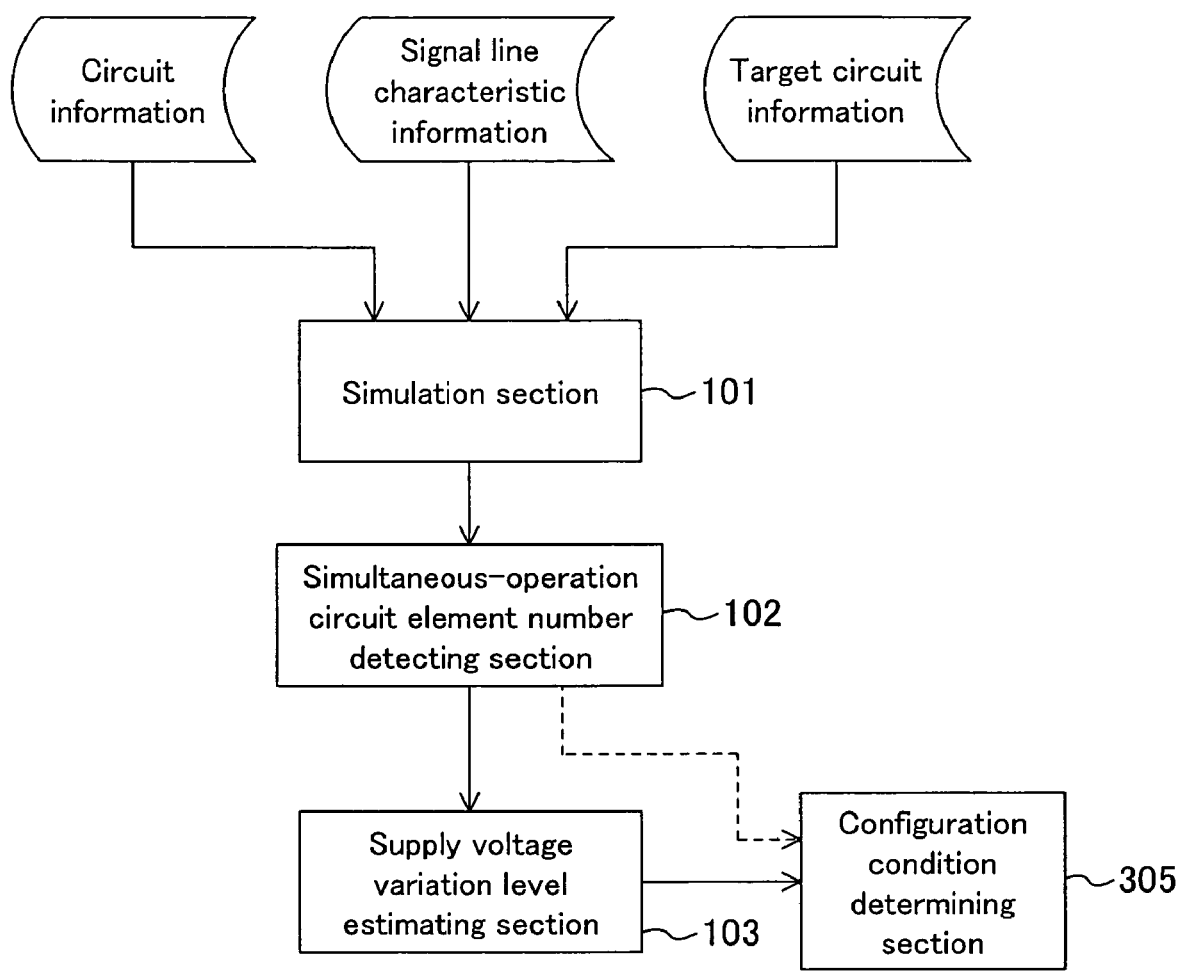
FIG. 9 is a block diagram showing a functional structure of an error portion detecting device of embodiment 3.

Referring to FIG. 9, an error portion detecting device for a semiconductor integrated circuit according to embodiment 3 includes a configuration condition determining section 305 in addition to the components of embodiment 1. The configuration condition determining section 305 determines restrictive conditions for the layout design based on the variation level of the supply voltage which has been estimated by the supply voltage variation level estimating section 103 (or based on the number of circuit elements which has been detected by the simultaneous-operation circuit element number detecting section 102). It should be noted that the configuration condition determining section 305 may be provided in the structure of the error portion detecting device of embodiment 2.

Figure 10:
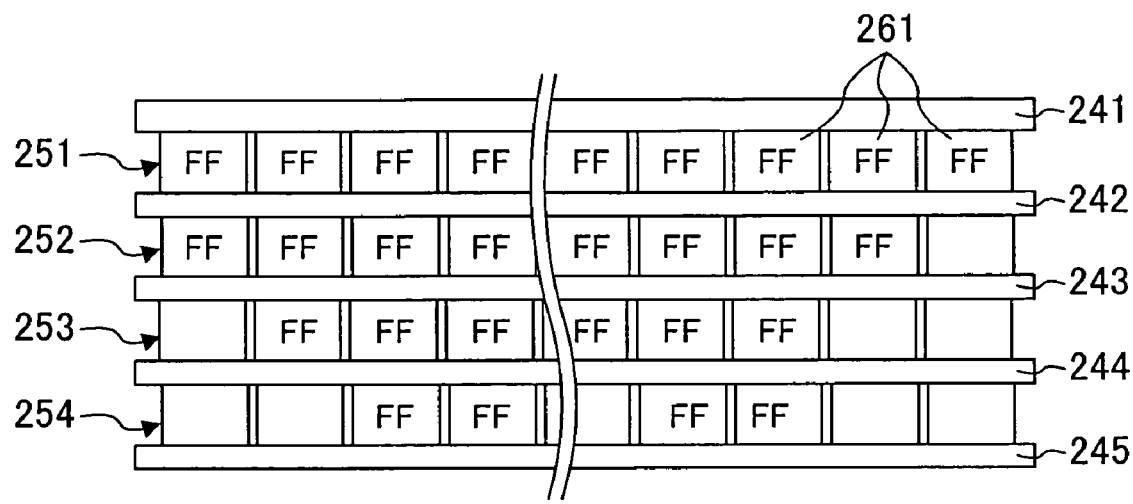
FIG. 10 shows still another example of the configuration of circuit elements and power supply lines in a semiconductor integrated circuit.

Specifically, as shown in FIG. 10, a plurality of flip-flop cells 261 are provided in each of lanes 251 to 254 that exist between power supply lines 241 (VDD), 242 (VSS), 243 (VDD), 244 (VSS), and 245 (VDD). If the number of flip-flop cells 261 in the lane 251 to which clock signals are input within a transition timing range of 0.3 ns or shorter is greater than a predetermined number or greater than in any of the other lanes 252 to 254, the configuration condition determining section 305 outputs information about restrictions on the configuration conditions such that some of the flip-flop cells 261 in the lane 251 are moved to another lane, thereby instructing a layout device (not shown) to rearrange the configuration of the flip-flop cells 261. Some of the flip-flop cells 261 may be moved from the lane 251 to the adjacent lane 252 but are preferably moved to the lane 253 rather than the lane 252 because both the VDD line and VSS line connected to the flip-flop cells 261 of the lane 253 are different from those of the flip-flop cells 261 of the lane 251. Alternatively, some flip-flop cells 261 may be moved to a region that is powered through a power supply line different from the power supply lines from which the power supply lines 241 to 245 branch.

Alternatively, a flip-flop cell 261 in a selected lane may be exchanged with a flip-flop cell 261 in another lane to which a clock signal of a different transition timing is input instead of simply moving the flip-flop cells 261 to another lane. Further, embodiment 3 is not limited to estimation of the variation in the supply voltage which is carried out after the layout is once determined. For example, in a possible example of the present invention, circuit elements that receive input signals whose transition timings are equal at the logic design level are detected in advance, and the layout device is controlled such that the number of such circuit elements in one lane does not exceed a predetermined number.

(Other Embodiments of the Present Invention)

Figure 11:
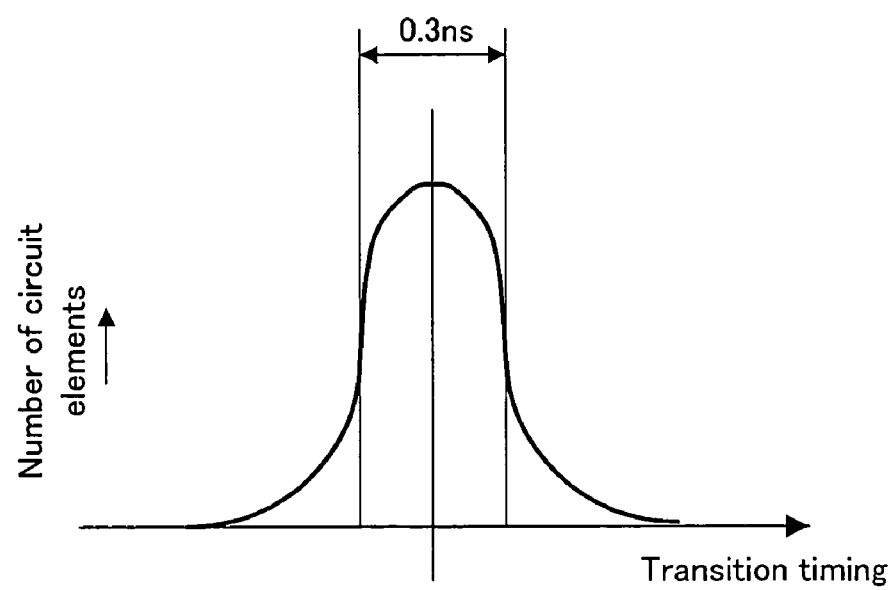
FIG. 11 is a graph illustrating a distribution of the transition timings of input signals.
Figure 12:
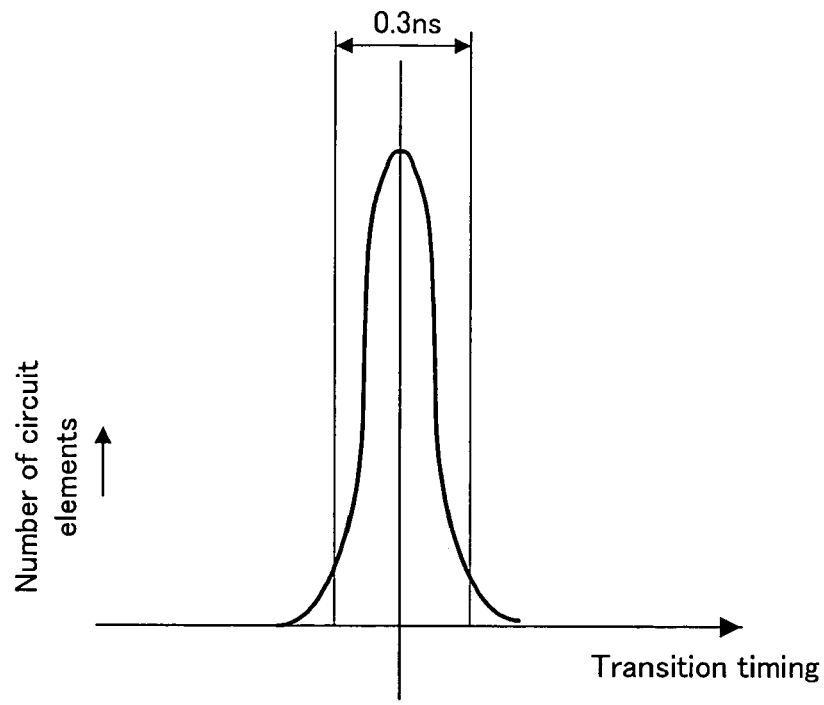
FIG. 12 is a graph illustrating a distribution of the transition timings of input signals.

According to the present invention, the variation of the transition timings may be considered in addition to calculation of the number of circuit elements whose input signals transition within a predetermined time interval as described above. That is, when the number of such circuit elements is equal but the distribution of the number of circuit elements over the transition timing is different as shown in FIGS. 11 and 12, the accumulatively-increasing effect of the variation in the supply voltage becomes greater as the distribution becomes smaller. In view of such, as for circuit elements whose input signals transition within a predetermined time interval, the standard deviation of the transition timings is obtained, and the variation level of the supply voltage is obtained based on the obtained standard deviation and the number of circuit elements whose input signals transition within a predetermined time interval (for example, based on the product of these factors, the result value of weighted addition of these factors, or the like). Herein, the above variation is not limited to one caused by a difference in the delay time which results from the circuit design, but a variation in the production may be considered instead.

Figure 13:
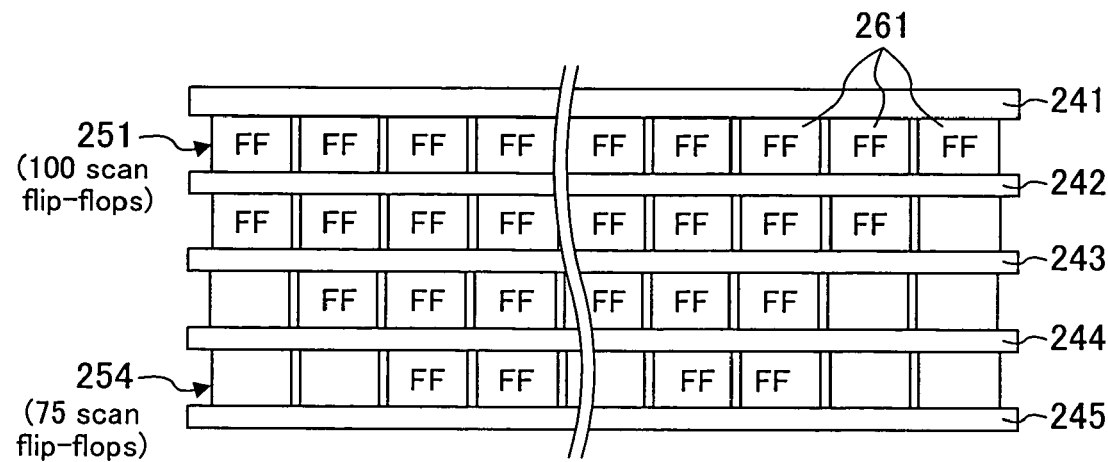
FIG. 13 shows still another example of the configuration of circuit elements and power supply lines in a semiconductor integrated circuit.

In the case where the variation of the transition timings of input signals to a plurality of circuit elements is considered to be generally constant among lanes of the circuit elements, the number of circuit elements in which the transition timings of the input signals are equal in the logic design level (i.e., the number of circuit elements that are considered to operate simultaneously in the logic design level) may be obtained for each lane, and allocation of the circuit elements to the lanes may be determined based on the obtained number. Specifically, as shown in FIG. 13, in the case where 100 flip-flop cells (circuit elements) 261 that operates simultaneously as described above are included in the lane 251 and 75 such flip-flop cells 261 are included in the lane 254, it is estimated that the variation in the supply voltage is greater in the power supply lines 241 and 242 than in the power supply lines 244 and 245. In such a case, the configuration of circuit elements is determined such that the number of circuit elements that operate simultaneously is equal among the lanes, or such that the number of such circuit elements in each lane is equal to or smaller than a predetermined number.

(Other Features)

In the above examples, the transition timings of the input signals to the respective circuit elements have been considered. However, according to the present invention, the above-described process may be performed for the transition of an output signal. Since the transition timing of the output signal of a circuit element is delayed from that of the input signal of the circuit element by only a delay time caused by the circuit element, a portion of a semiconductor integrated circuit which has a high possibility of error occurring can be estimated by the above-described mechanism.

Figure 14:
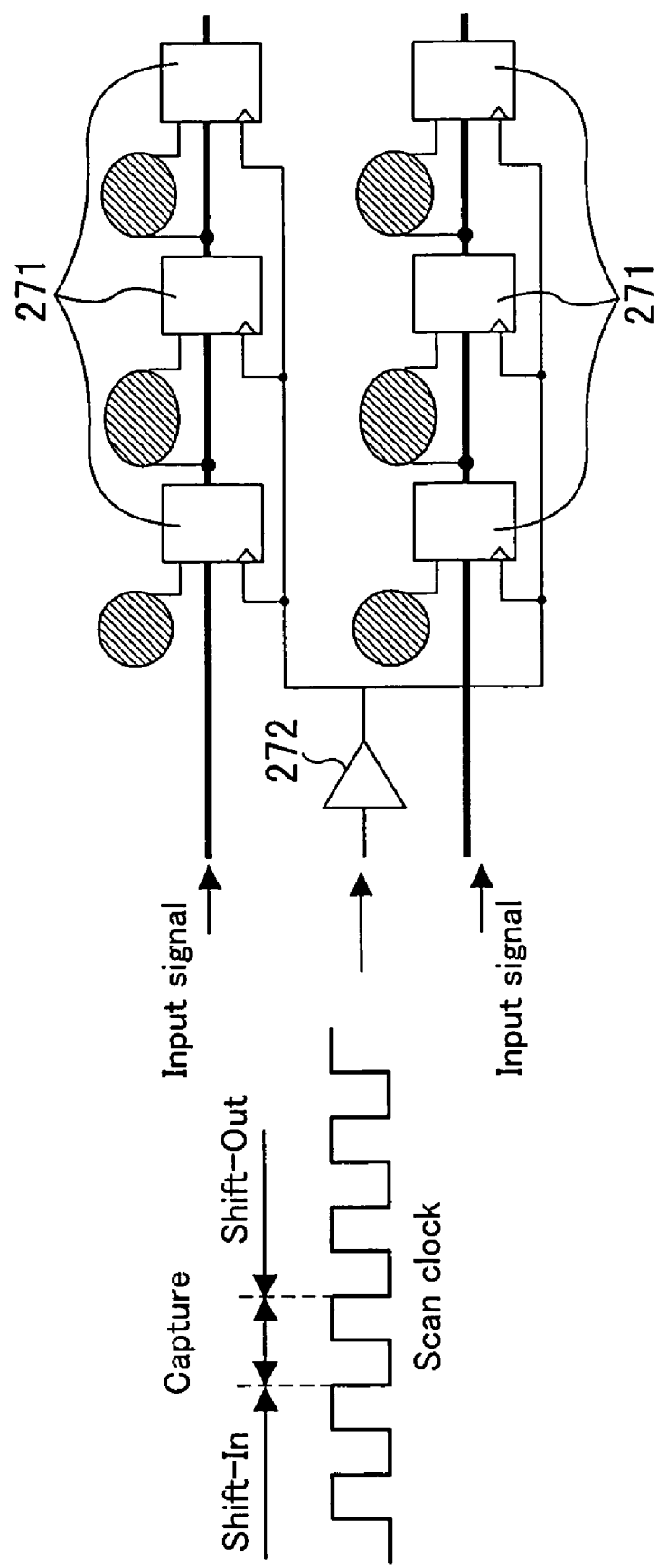
FIG. 14 is a circuit diagram illustrating a circuit example of a scan chain.
Figure 15:
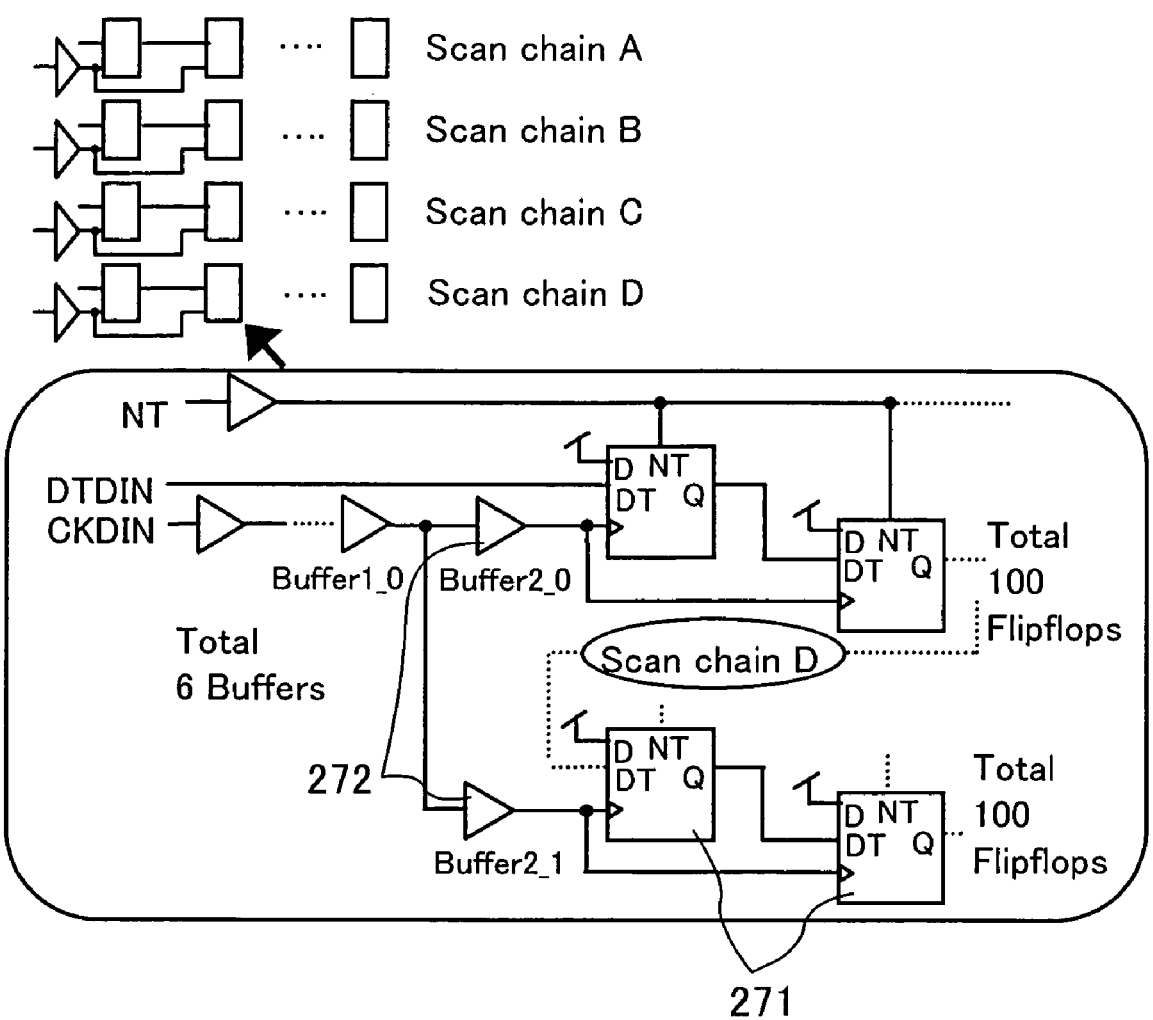
FIG. 15 is a circuit diagram illustrating another circuit example of a scan chain.

In the above embodiments, a flip-flop has been described as an example of a circuit element, but the present invention is not limited thereto. The circuit element may be a buffer or may be a single transistor. Even in such cases, the same effects are likewise achieved. For example, a scan chain used for testing the operation of a circuit generally includes a relatively large number of scan flip-flops 271 and buffers 272 as shown in FIGS. 14 and 15, and these circuit elements of the scan chain operate simultaneously. Thus, reduction of the variation in the supply voltage readily produces a large effect and is especially effective against a malfunction which may occur during a scanning operation. Furthermore, a clock signal is generally used for establishing a synchronization among circuit elements in various clock-synchronized circuits and therefore input to many circuit elements, and thus, a large effect can be achieved when the clock signal is utilized as a target signal of the above-described process. However, the present invention is not limited to the clock signal. The same effect can be achieved even when any of various signals input to a plurality of circuit elements is utilized as the target signal. Furthermore, the present invention is not limited to a signal which is input to circuit elements after passing through a special circuit, such as a clock tree synthesis buffer. Signals which are input to a plurality of circuit elements after passing through different types of logic circuits may be used as the target signal(s) in the above process so long as the signals input to the circuit elements transition substantially at the same timing.

In the above examples, the number of circuit elements itself is considered. However, in the case where a circuit includes circuit elements which differently influence the variation in the supply voltage because of driving different load capacitors, a value obtained by weighting the number of circuit elements with a load capacitance or driving capacity may be used.

Whether or not a power supply line is "common" is determined relatively to the "extent" of a single element to which the supply voltage is supplied. For example, in the example shown in FIG. 3, when a set of circuit cells included in each lane 213, such as a buffer cell 214, or the like, is assumed as a single circuit element, a common power supply line for commonly supplying the supply voltage to the circuit elements means a power supply line from which the power supply lines 211 and 212 branch (i.e., a power supply line for supplying the supply voltage to the power supply lines 211 and 212). When each transistor or a set of several transistors included in the buffer cell 214, or the like, is assumed as a single circuit element, a line which is branched from the power supply lines 211 and 212 and supplies the supply voltage to a plurality of transistors is a common power supply line for the plurality of transistors. (It should be noted that, also in the above cases, the power supply lines 211 and 212 may be assumed as common power supply lines.)

As described above, according to the present invention, a portion of a semiconductor integrated circuit which has a high possibility of error occurring due to a variation in the supply voltage is conveniently specified, whereby the specified vulnerable portion is readily countermeasured in a mask layout process.

What is claimed is:

1. An error portion detecting method for a semiconductor integrated circuit, comprising:
    a transition timing detecting step of detecting a transition timing of an input signal input to or a transition timing of an output signal output from, each of circuit elements which are supplied with a supply voltage through a common power supply line;
    a simultaneous-operation circuit element number detecting step of detecting a number of circuit elements in which the transition timing of the input signal or output signal occurs within a predetermined time interval;
    a supply voltage variation level estimating step of estimating a supply voltage variation level based on the number of circuit elements which is detected at the simultaneous-operation circuit element number detecting step; and
    an outputting step of outputting the estimated supply voltage variation level.

2. The error portion detecting method of claim 1, wherein the supply voltage variation level estimating step includes a step of estimating the supply voltage variation level based on a variation of the transition timings detected at the transition timing detecting step.

3. The error portion detecting method of claim 1, wherein the circuit elements are transistors.

4. The error portion detecting method of claim 1, wherein the circuit elements are buffer circuits.

5. The error portion detecting method of claim 1, wherein:
the circuit elements are scan flip-flops for testing an operation of the semiconductor integrated circuit; and
the input signal is a clock signal which is input to the scan flip-flops.

6. The error portion detecting method of claim 1, wherein the transition timing detecting step includes a step of detecting the transition timing of the input signal or output signal by simulating an operation of the semiconductor integrated circuit.

7. The error portion detecting method of claim 1, wherein the transition timing detecting step includes a step of detecting the transition timing of the input signal or output signal based on a delay time caused by at circuit element and signal line for transmitting the input signal to each or the circuit elements.

8. An error portion detecting method for a semiconductor integrated circuit, comprising:
a circuit element number detecting step of detecting a number of circuit elements which are supplied with a supply voltage through a common power supply line and in which input signals are supposed to simultaneously transition when a delay caused by a signal line is neglected;
a supply voltage variation level estimating step or estimating a supply voltage variation level based on the number detected at the circuit element number detecting step; and
an outputting step of outputting the estimated supply voltage variation level.

9. A layout method for a semiconductor integrated circuit, comprising:
a transition timing detecting step of detecting a transition timing of an input signal input to, or a transition timing of an output signal output from, each of circuit elements which are supplied with a supply voltage through a common power supply line;
a simultaneous-operation circuit element number detecting step of detecting a number of circuit elements in which the transition timing of the input signal or output signal occurs within a predetermined time interval; and
a configuration determining step of determining a configuration of the circuit elements or a configuration of power supply lines based on the number of circuit elements which is detected at the simultaneous-operation circuit element number detecting step, such that any of the circuit elements is supplied with the supply voltage through a power supply line different from the common power supply line.

10. A computer-readable medium storing an error portion detecting program for a semiconductor integrated circuit which instructs a computer to execute the following steps:
a transition timing detecting step of detecting a transition timing of an input signal input to, or a transition timing of an output signal output from, each of circuit elements which are supplied with a supply voltage through a common power supply line;
a simultaneous-operation circuit element number detecting step of detecting a number of circuit elements in which the transition timing of the input signal or output signal occurs within a predetermined time interval;
a supply voltage variation level estimating step of estimating a supply voltage variation level based on the number of circuit elements which is detected at the simultaneous-operation circuit element number detecting step; and
an outputting step of outputting the estimated supply voltage variation level.

11. A computer-readable medium storing a layout program for a semiconductor integrated circuit which instructs a computer to execute the following steps:
a transition timing detecting stop of detecting a transition timing of an input signal input to, or a transition timing of an output signal output from, each of circuit elements which are supplied with a supply voltage through a common power supply line;
a simultaneous-operation circuit element number detecting step of detecting a number of circuit elements in which the transition timing of the input signal or output signal occurs within a predetermined time interval; and
a configuration determining step of determining a configuration of the circuit elements or a configuration of power supply lines based on the number of circuit elements which is detected at the simultaneous-operation circuit element number detecting step, such that any of the circuit elements is supplied with the supply voltage through a power supply line different from the common power supply line.

* * * * *